United States Patent
Lin et al.

(10) Patent No.: US 9,324,819 B1
(45) Date of Patent: Apr. 26, 2016

(54) SEMICONDUCTOR DEVICE

(71) Applicant: DELTA ELECTRONICS, INC., Kuei San (TW)

(72) Inventors: Li-Fan Lin, Kuei San (TW); Shih-Peng Chen, Kuei San (TW)

(73) Assignee: DELTA ELECTRONICS, INC. (TW)

( * ) Notice: Subject to any disclaimer, the term of this patent is extended or adjusted under 35 U.S.C. 154(b) by 0 days.

(21) Appl. No.: 14/555,056

(22) Filed: Nov. 26, 2014

(51) Int. Cl.
| | |
|---|---|
| *H01L 29/66* | (2006.01) |
| *H01L 29/417* | (2006.01) |
| *H01L 29/06* | (2006.01) |
| *H01L 29/40* | (2006.01) |
| *H01L 23/495* | (2006.01) |
| *H01L 23/528* | (2006.01) |
| *H01L 23/522* | (2006.01) |
| *H01L 29/78* | (2006.01) |
| *H01L 27/088* | (2006.01) |

(52) U.S. Cl.
CPC .... *H01L 29/41758* (2013.01); *H01L 23/49562* (2013.01); *H01L 23/528* (2013.01); *H01L 23/5226* (2013.01); *H01L 27/088* (2013.01); *H01L 29/0696* (2013.01); *H01L 29/402* (2013.01); *H01L 29/78* (2013.01)

(58) Field of Classification Search
CPC ...................... H01L 29/6659; H01L 29/41758; H01L 23/49562; H01L 23/5226; H01L 23/528; H01L 27/088; H01L 29/0696; H01L 29/402; H01L 29/78
See application file for complete search history.

(56) References Cited

U.S. PATENT DOCUMENTS

| | | | | |
|---|---|---|---|---|
| 6,664,603 | B2 * | 12/2003 | Karasawa et al. | 257/393 |
| 6,969,909 | B2 | 11/2005 | Briere | |
| 6,972,464 | B2 | 12/2005 | Shen | |
| 7,375,424 | B2 | 5/2008 | Connah | |
| 7,466,012 | B2 | 12/2008 | standing et al. | |
| 8,035,169 | B2 * | 10/2011 | Ishida et al. | 257/401 |
| 8,274,121 | B2 | 9/2012 | Vorhaus | |
| 8,399,912 | B2 | 3/2013 | Cheah et al. | |
| 2006/0202320 | A1 | 9/2006 | Schaffer | |
| 2010/0258844 | A1 | 10/2010 | Lidow et al. | |
| 2012/0313147 | A1 | 12/2012 | Anderson et al. | |

FOREIGN PATENT DOCUMENTS

| | | |
|---|---|---|
| CN | 102034823 | 4/2011 |
| TW | I229936 | 3/2005 |
| TW | I359493 | 1/2008 |
| TW | 201349456 | 12/2013 |

* cited by examiner

*Primary Examiner* — Fernando L Toledo
*Assistant Examiner* — Neil Prasad
(74) *Attorney, Agent, or Firm* — Hauptman Ham, LLP

(57) ABSTRACT

A semiconductor device includes an active layer, source electrodes, drain electrodes, gate electrodes, a first dielectric layer, source trace, first source vias, a second dielectric layer, a source pad, and second source vias. The first dielectric layer covers the source electrodes, the drain electrodes, and the gate electrodes. The source traces are disposed on the first dielectric layer, are electrically connected to the source electrodes, and are covered by the second dielectric layer. The source pad is disposed on the second dielectric layer, and includes a first source trunk, a first source branch, and a source sub-branch. The first source branch is protruded from the first source trunk and is electrically connected to one of the drain traces through the second source vias. The source sub-branch is protruded from the first source branch and is electrically connected one of the source electrodes through the third source vias.

22 Claims, 12 Drawing Sheets

SEMICONDUCTOR DEVICE

BACKGROUND

1. Field of Invention

The present invention relates to a semiconductor device.

2. Description of Related Art

A field effect transistor is a switch device, which controls a current flowing through it with an electric field generated in a material layer, widely utilized in circuits made up of semiconductor devices. In particular, the field effect transistor includes a gate electrode, a source electrode, a drain electrode, and an active layer. By controlling the voltage applied to the gate electrode, the electric field in the active layer is changed to allow current to flow from the source electrode to the drain electrode. As a result, the field effect transistor is in an on state.

Generally speaking, a field effect transistor may further include a source pad and a drain pad, which are electrically connected to the source electrode and the drain electrode respectively, to allow the field effect transistor to be electrically connected to another device. The source pad and the drain pad usually have large bonding areas to facilitate the bonding of external circuits. The progress in semiconductor processing facilitates the miniaturization of field effect transistors. It is essential to provide a well-placed source pad and drain pad with adequate bonding areas and less electrical interference on the field effect transistor itself.

SUMMARY

An aspect of the present invention is to provide a semiconductor device includes an active layer, a plurality of source electrodes, a plurality of drain electrodes, a plurality of gate electrodes, a first dielectric layer, a plurality of source trace, a plurality of first source vias, a second dielectric layer, a source pad, and a plurality of second source vias. The source electrodes are disposed on the active layer and extending along a first direction. The drain electrodes are disposed on the active layer and alternately arranged with the source electrodes. The gate electrodes are respectively disposed between the source electrodes and the drain electrodes. The first dielectric layer covers the source electrodes, the drain electrodes, and the gate electrodes. The source traces are disposed on the first dielectric layer. The first source vias are disposed in the first dielectric layer and interconnects the source electrodes and the source traces. The second dielectric layer covers the source traces. The source pad is disposed on the second dielectric layer, and includes a first source trunk, a first source branch, and a source sub-branch. The first trunk extends along the first direction. The first source branch is protruded from the first source trunk and disposed above one of the source traces. The source sub-branch is protruded from the first source branch and is disposed above one of the source electrodes. The second source vias are disposed in the second dielectric layer and interconnect the source pad and the source traces.

In one or more embodiments, the semiconductor device further includes a plurality of drain traces, a plurality of first drain vias, a drain pad, and a plurality of second drain vias. The drain traces are disposed on the first dielectric layer and alternately arranged with the source traces. The second dielectric layer further covers the drain traces. The first drain vias are disposed in the first dielectric layer and interconnects the drain electrodes and the drain traces. The drain pad is disposed on the second dielectric layer, and includes a first drain trunk, a first drain branch, and a drain sub-branch. Both of the first drain electrodes and the first drain trunk extend along the first direction. The first drain branch is protruded from the first drain trunk and is disposed above one of the drain traces. The drain sub-branch is protruded from the first drain branch and is disposed above one of the drain electrodes. The second drain vias is disposed in the second dielectric layer and interconnect the drain pad and the drain traces.

In one or more embodiments, the semiconductor device further includes a plurality of third drain vias. The third drain vias is disposed in both the first dielectric layer and the second dielectric layer and interconnect the drain pad and the drain electrodes.

In one or more embodiments, the first source branch and the first drain branch are alternately arranged.

In one or more embodiments, the source sub-branch and the drain sub-branch are alternately arranged.

In one or more embodiments, at least one of the drain traces includes a second drain trunk and a second drain branch. The second drain trunk extends along a second direction, wherein the second direction is substantially perpendicular to the first direction. The second drain branch is protruded from the second drain trunk and is disposed above one of the drain electrodes.

In one or more embodiments, at least one of the drain traces includes a plurality of drain strips disposed between the first drain trunk of the drain pad and the drain electrodes, wherein the drain strips are separated from each other.

In one or more embodiments, the first dielectric layer includes a top portion and a lower portion disposed between the top portion and the active layer. At least one of the first drain vias includes a top drain via and a bottom drain via, and the semiconductor device further includes a metal layer disposed between one of the drain traces and one of the drain electrodes and between the top portion and the lower portion. The top drain via is disposed in the top portion and interconnects the drain trace and the metal layer, and the bottom drain via is disposed in the bottom portion and interconnects the metal layer and the drain electrode.

In one or more embodiments, the semiconductor device further includes an insulating layer covering a portion of the drain pad and exposing the first drain trunk.

In one or more embodiments, the insulating layer further exposes a portion of the first drain branch.

In one or more embodiments, the semiconductor device further includes a plurality of third source vias. The third source vias are disposed in both the first dielectric layer and the second dielectric layer and interconnect the source pad and the source electrodes.

In one or more embodiments, at least one of the source traces includes a second source trunk and a second source branch. The second source trunk extends along a second direction, wherein the second direction is substantially perpendicular to the first direction. The second source branch is protruded from the second source trunk and is disposed above one of the source electrodes.

In one or more embodiments, at least one of the source traces includes a plurality of source strips disposed between the first source trunk of the source pad and the source electrodes, wherein the source strips are separated from each other.

In one or more embodiments, the first dielectric layer inlcudes a top portion and a lower portion disposed between the top portion and the active layer. At least one of the first source vias inlcudes a top source via and a bottom source via. The semiconductor device further includes a metal layer disposed between one of the source traces and one of the source electrodes and between the top portion and the lower portion. The top source via is disposed in the top portion and interconnects the source trace and the metal layer, and the bottom source via is disposed in the bottom portion and interconnects the metal layer and the source electrode.

In one or more embodiments, the metal layer is further disposed above one of the gate electrodes.

In one or more embodiments, the semiconductor device further includes a field plate disposed between the top portion and the bottom portion and above one of the gate electrodes. The field plate is electrically connected to the gate electrodes.

In one or more embodiments, the semiconductor device further includes a field plate disposed between the top portion and the bottom portion and above one of the gate electrodes. The field plate is electrically isolated from the gate electrodes, the source electrodes, and the drain electrodes.

In one or more embodiments, the semiconductor device further includes an insulating layer covering a portion of the source pad and exposing the first source trunk.

In one or more embodiments, the insulating layer further exposes a portion of the first source branch.

In one or more embodiments, the semiconductor device further includes a substrate and a lead frame. The lead frame includes a first portion, a second portion, a third portion, and a fourth portion. The first portion is electrically isolated from the source electrodes, the drain electrodes, and the gate electrodes. The substrate is disposed between the first portion and the active layer. The second portion is electrically connected to the source electrodes. The third portion is electrically connected to the drain electrodes. The fourth portion is electrically connected to the gate electrodes.

In one or more embodiments, the semiconductor device further includes a substrate and a lead frame. The lead frame includes a first portion, a second portion, and a third portion. The first portion is electrically connected to the gate electrodes. The substrate is disposed between the first portion and the active layer. The second portion is electrically connected to the source electrodes. The third portion is electrically connected to the drain electrodes.

Another aspect of the present invention is to provide a semiconductor device includes an active layer, a plurality of source electrodes, a plurality of drain electrodes, a plurality of gate electrodes, a first dielectric layer, a plurality of drain trace, a plurality of first drain vias, a second dielectric layer, a drain pad, and a plurality of second drain vias. The source electrodes are disposed on the active layer. The drain electrodes are disposed on the active layer, are alternately arranged with the source electrodes, and extend along a first direction. The gate electrodes are respectively disposed between the source electrodes and the drain electrodes. The first dielectric layer covers the source electrodes, the drain electrodes, and the gate electrodes. The drain traces are disposed on the first dielectric layer. The first drain vias are disposed in the first dielectric layer and interconnects the drain electrodes and the drain traces. The second dielectric layer covers the drain traces. The drain pad is disposed on the second dielectric layer, and includes a first drain trunk, a first drain branch, and a drain sub-branch. The first drain trunk extends along the first direction. The first drain branch is protruded from the first drain trunk and disposed above one of the drain traces. The drain sub-branch is protruded from the first drain branch and is disposed above one of the drain electrodes. The second drain vias are disposed in the second dielectric layer and interconnect the drain pad and the drain traces.

DETAILED DESCRIPTION

Figure 1:
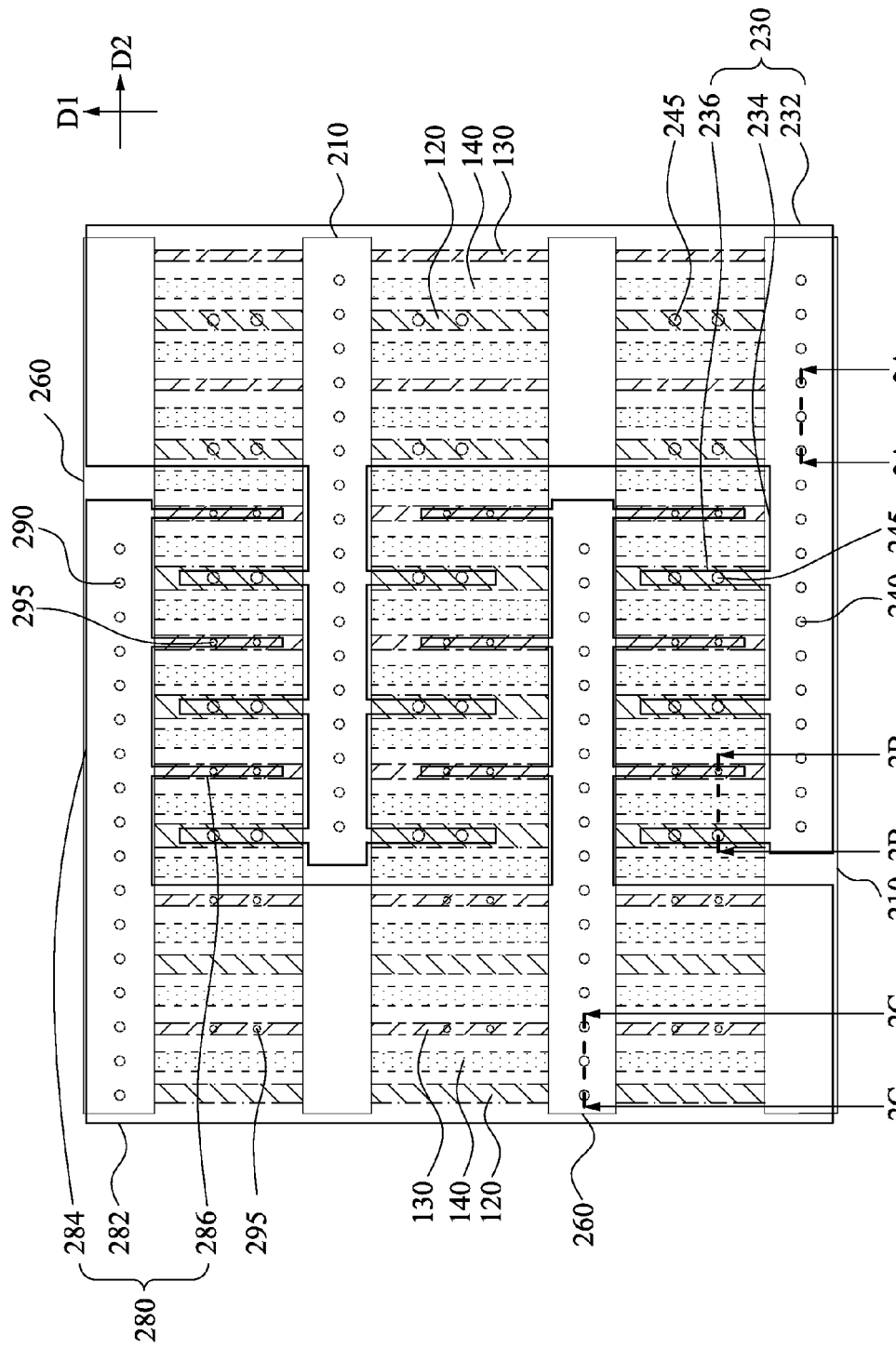
FIG. 1 is a top view of a semiconductor device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2A:
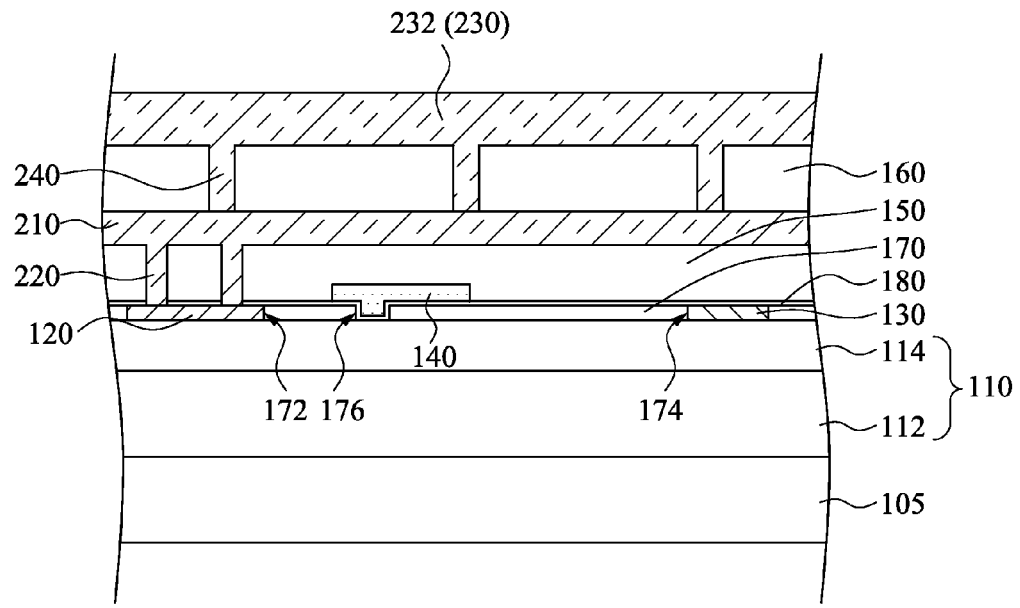
FIG. 2A is a cross-sectional view taken along line 2A-2A of FIG. 1.
Figure 2B:
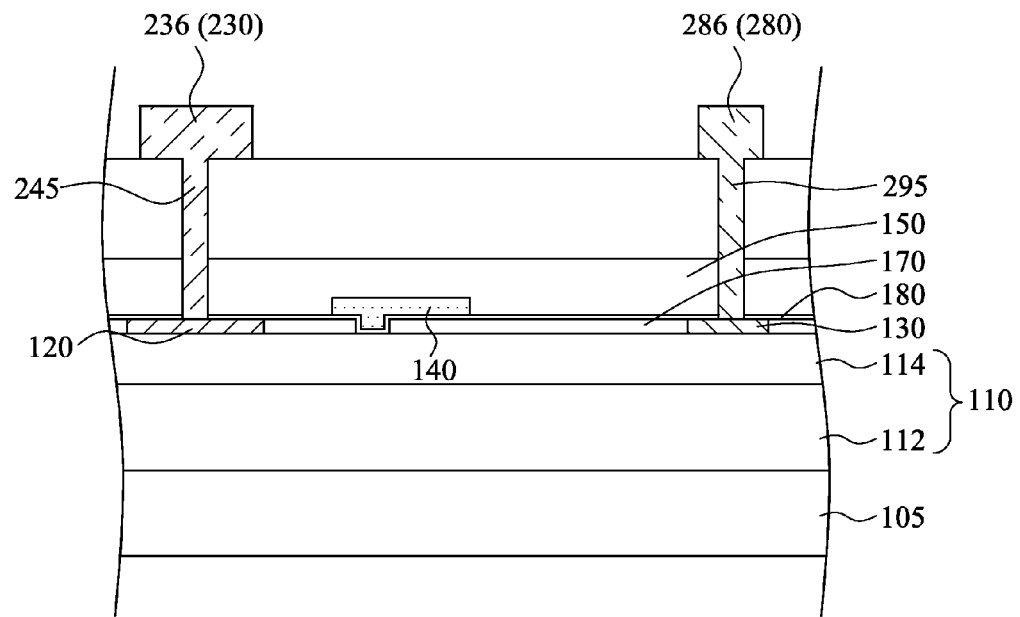
FIG. 2B is a cross-sectional view taken along line 2B-2B of FIG. 1.

FIG. 1 is a top view of a semiconductor device according to one embodiment of the present invention, FIG. 2A is a cross-sectional view taken along line 2A-2A of FIG. 1, and FIG. 2B is a cross-sectional view taken along line 2B-2B of FIG. 1. The semiconductor device includes an active layer 110, a plurality of source electrodes 120, a plurality of drain electrodes 130, a plurality of gate electrodes 140, a first dielectric layer 150, a plurality of source traces 210, a plurality of first source vias 220, a second dielectric layer 160, a source pad 230, a plurality of second source vias 240, and a plurality of third source vias 245. For clarity, the first source vias 220 are depicted in FIGS. 2A and 2B and are omitted in FIG. 1. The source electrodes 120 are disposed on the active layer 110. The drain electrodes 130 are disposed on the active layer 110 and are alternately arranged with the source electrodes 120. The gate electrodes 140 are respectively disposed between the source electrodes 120 and the drain electrodes 130. All of the source electrodes 120, the drain electrodes 130, and the gate electrodes 140 extend along a first direction D1. The first dielectric layer 150 covers the source electrodes 120, the drain electrodes 130, and the gate electrodes 140. The source traces 210 are disposed on the first dielectric layer 150. The first source vias 220 are disposed in the first dielectric layer 150 and interconnect the source electrodes 120 and the source traces 210. The second dielectric layer 160 covers the source traces 210. The source pad 230 is disposed on the second dielectric layer 160, and includes a first source trunk 232, a first source branch 234, and a source sub-branch 236. The first source trunk 232 extends along the first direction D1. The first source branch 234 is protruded from the first source trunk 232 and disposed above one of the source traces 210. The source sub-branch 236 is protruded from the first source branch 234 and is disposed above one of the source electrodes 120. The second source vias 240 are disposed in the second dielectric layer 160 and interconnect the source pad 230 and the source traces 210. The third source vias 245 are disposed in both the first dielectric layer 150 and the second dielectric layer 160 and interconnect the source pad 230 and the source electrodes 120. For example, in this embodiment, some of the third source vias 245 interconnect the first source trunk 232 and the source electrodes 120, and the others interconnect the source sub-branch 236 and the source electrodes 120.

Figure 2C:
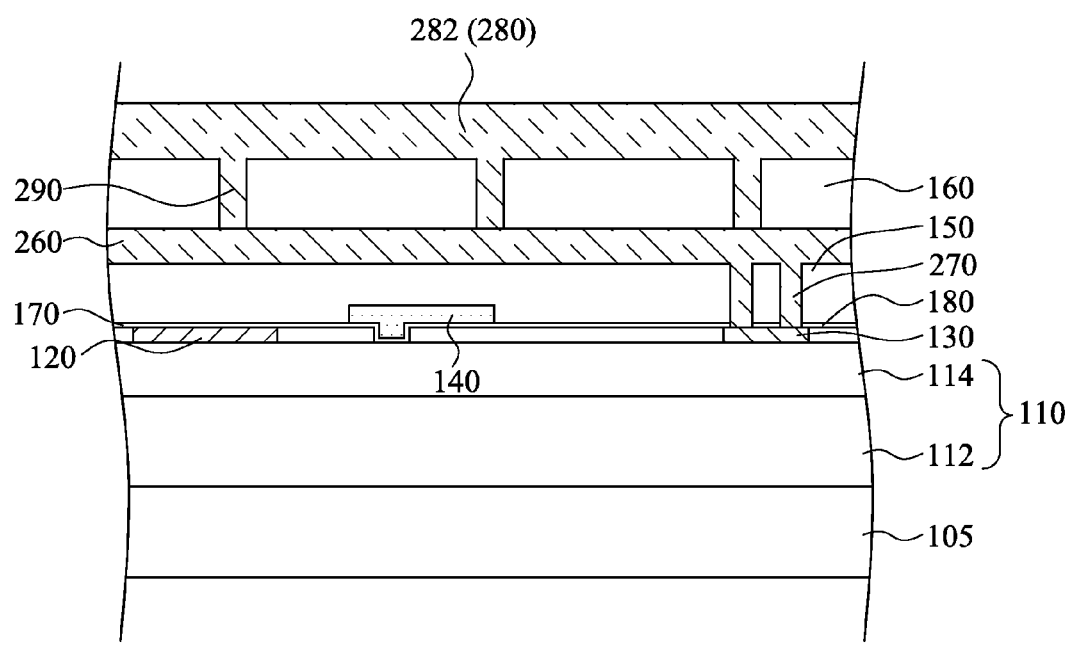
FIG. 2C is a cross-sectional view taken along line 2C-2C of FIG. 1.

FIG. 2C is a cross-sectional view taken along line 2C-2C of FIG. 1. Reference is made to FIGS. 1, 2B, and 2C. Furthermore, the semiconductor device further includes a plurality of drain traces 260, a plurality of first drain vias 270, a drain pad 280, a plurality of second drain vias 290, and a plurality of third drain vias 295. For clarity, the first drain vias 270 are depicted in FIGS. 2B and 2C and are omitted in FIG. 1. The drain traces 260 are disposed on the first dielectric layer 150 and alternately arranged with the source traces 210. The second dielectric layer 160 further covers the drain traces 260. The first drain vias 270 are disposed in the first dielectric layer 150 and interconnect the drain electrodes 130 and the drain traces 260. The drain pad 280 is disposed on the second dielectric layer 160, and includes a first drain trunk 282, a first drain branch 284, and a drain sub-branch 286. The first drain trunk 282 extends along the first direction D1. The first drain branch 284 is protruded from the first drain trunk 282 and is disposed above one of the drain traces 260. The drain sub-branch 286 is protruded from the first drain branch 284 and is disposed above one of the drain electrodes 130. The second drain vias 290 is disposed in the second dielectric layer 160 and interconnect the drain pad 280 and the drain traces 260. The third drain vias 295 is disposed in both the first dielectric layer 150 and the second dielectric layer 160 and interconnect the drain pad 280 and the drain electrodes 130. For example, in this embodiment, some of the third drain vias 295 interconnect the first drain trunk 282 and the drain electrodes 130, and the others interconnect the drain sub-branch 286 and the drain electrodes 130. The semiconductor device further includes a gate pad (not shown) electrically connected to the gate electrodes 140.

In this embodiment, since the source electrodes 120 are electrically connected to the source traces 210 through the first source vias 220, and are electrically connected to the source pad 230 through the third source vias 245, and also the source traces 210 are electrically connected to the source pad 230 through the second source vias 240, the resistance of the source electrodes 120 themselves can be effectively reduced. In addition, since the first source branch 234 is disposed above one of the source traces 210, and does not overlap the drain traces 260, there is no capacitance existing between the first source branch 234 and the drain traces 260. Also, the source sub-branch 236 does not increase the capacitance value since it is disposed above one of the source electrodes 120 and does not overlap the drain electrodes 130. As a result, the structure of the source pad 230 can reduce the resistance of the source electrodes 120 while there is no additional source-drain capacitance existing among the semiconductor device.

Moreover, since the drain electrodes 130 are electrically connected to the drain traces 260 through the first drain vias 270, and are electrically connected to the drain pad 280 through the third drain vias 295, and also the drain traces 260 are electrically connected to the drain pad 280 through the second drain vias 290, the resistance of the drain electrodes 130 themselves can be effectively reduced. In addition, since the first drain branch 284 is disposed above one of the drain traces 260, and does not overlap the source traces 210, there is no capacitance existing between the first drain branch 284 and the source traces 260. Also, the drain sub-branch 286 does not increase the capacitance value since it is disposed above one of the drain electrodes 130 and does not overlap the source electrodes 120. As a result, the structure of the drain pad 280 can reduce the resistance of the drain electrodes 130 while there is no additional source-drain capacitance existing among the semiconductor device.

Reference is made again to FIG. 1. In this embodiment, all of the source traces 210 and the drain traces 260 extend along a second direction D2 which is substantially perpendicular to the first direction D1. Also, the first source branch 234 and the first drain branch 284 extend along the second direction D2. In addition, the source sub-branch 236 and the drain sub-branch 286 extend along the first direction D1. Moreover, the number of the first source branches 234 and the first drain branches 284 can be plural, and the first source branches 234 and the first drain branches 284 are alternately arranged. Hence, the first source trunk 232 and the first source branches 234 can form a finger-shaped element, and the first drain trunk 282 and the first drain branches 284 can form a finger-shaped element. Also, the number of the source sub-branches 236 and the drain sub-branches 286 can be plural, and the source sub-branches 236 and the drain sub-branches 286 are alternately arranged. Hence, the first source branches 234 and the source sub-branches 236 can form finger-shaped elements, and the first drain branches 284 and the drain sub-branches 286 can form finger-shaped elements. Therefore, the space between the first source trunk 232 and the first drain trunk 282 can be filled by as many the first source branch 234, the first drain branch 284, the source sub-branch 236, and the drain sub-branch 286 as possible, resulting in a semiconductor device with low resistance and low capacitance.

In some embodiments, the first source vias 220, the second source vias 240, the third source vias 245, the first drain vias 270, the second drain vias 290, and the third drain vias 295 may be formed in the shape of a circle, a rectangle, a polygon, an arc, or their combinations according to manufacturing requirements. In another embodiment of the present invention, in addition to being strip-shaped, the first source branch 234, the source sub-branch 236, the first drain branch 284, and the drain sub-branch 236 may be wave-shaped, zigzag-shaped, irregularly shaped, or some combination thereof.

Reference is made to FIG. 2A, in the present embodiment, the semiconductor device can further include a passivation layer 170 covering the active layer 110. The passivation layer 170 has one source opening 172 and at least one drain opening 174 therein. The source electrode 120 and the drain electrode 130 are respectively disposed in the source opening 172 and the drain opening 174 to electrically connect the active layer 110.

In one or more embodiments, the semiconductor device can further include a gate dielectric layer 180 disposed at least between one of the gate electrodes 140 and the active layer 110. The first dielectric layer 150 covers the gate dielectric layer 180.

In one or more embodiments, the passivation layer 170 has at least one gate opening 176 therein. The gate dielectric layer 180 and the gate electrode 140 cover the gate opening 176. The presence of the gate opening 176 can function to adjust the electrical properties of the gate electrode 140. For example, the semiconductor device in this embodiment can be a depletion mode transistor. However, in other embodiments, the passivation layer 170 may not have the gate opening 176, and the invention is not limited in this respect.

In one or more embodiments, the active layer 110 includes a plurality of different nitride-based semiconductor layers to allow two-dimensional electron gas (2DEG) to be generated at the heterojunction so as to create a conducting path. For example, a stack structure made up of a gallium nitride (GaN) layer 112 and an aluminum gallium nitride (AlGaN) layer 114 may be utilized, and the aluminum gallium nitride layer 114 is disposed on the gallium nitride layer 112. With this structure, two-dimensional electron gas can exist at the interface of the gallium nitride layer 112 and the aluminum gallium nitride layer 114. Thus, when the semiconductor device is in the on state, the on current between the source electrode 120 and the drain electrode 130 is able to flow along the interface of the gallium nitride layer 112 and the aluminum gallium nitride layer 114. The active layer 110 may be selectively disposed on a substrate 105. The substrate 105 may be a silicon substrate or a sapphire substrate, but the invention is not limited in this respect. In one embodiment, the semiconductor device may further include a buffer layer disposed between the active layer 110 and the substrate 105.

Figure 3:
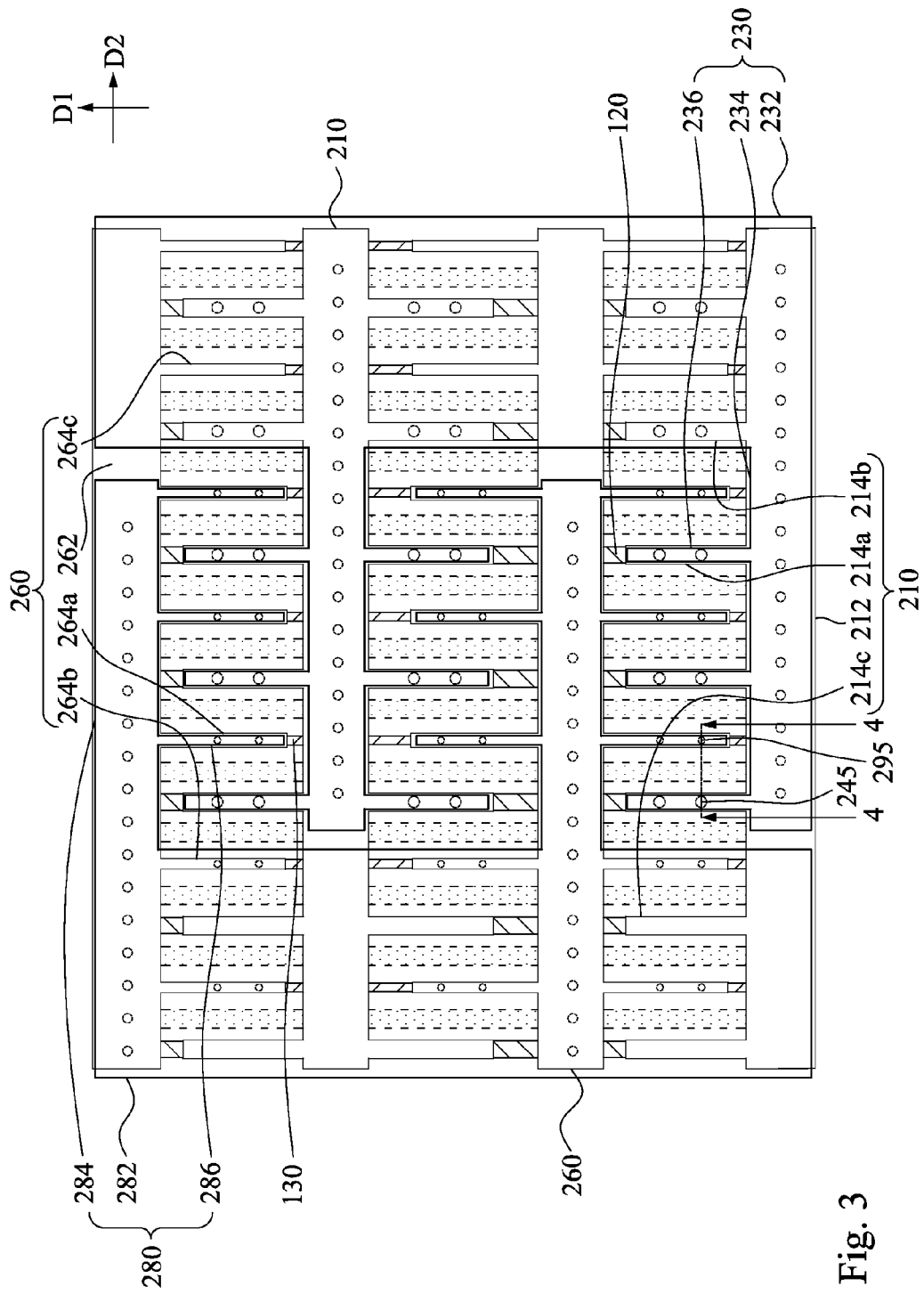
FIG. 3 is a top view of a semiconductor device according to another embodiment of the present invention.
Figure 4:
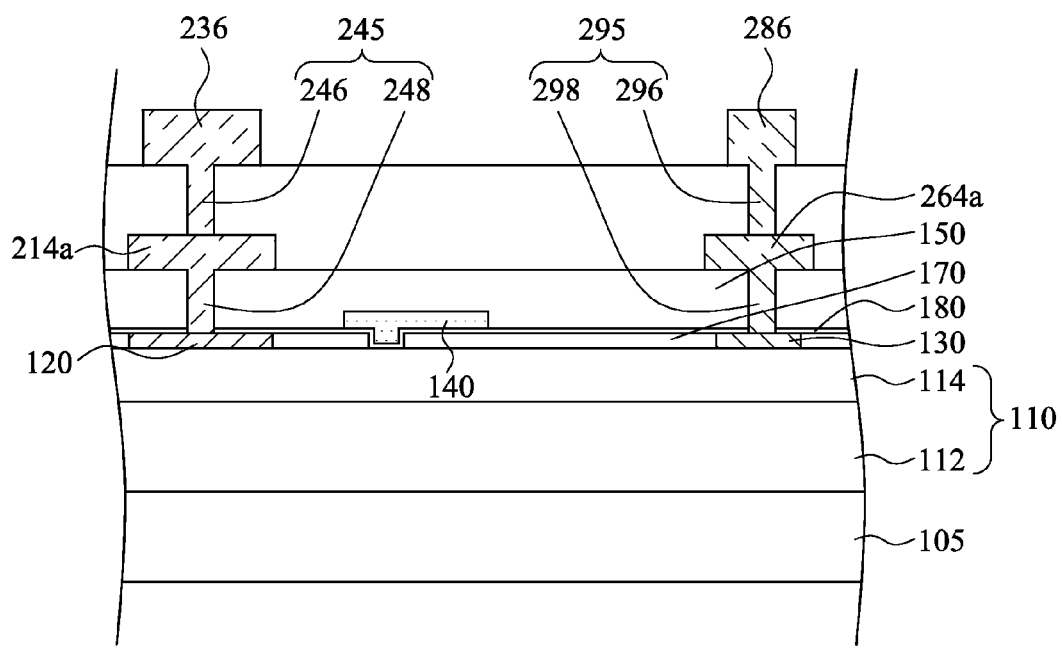
FIG. 4 is a cross-sectional view taken along line 4-4 of FIG. 3.

FIG. 3 is a top view of a semiconductor device according to another embodiment of the present invention, and FIG. 4 is a cross-sectional view taken along line 4-4 of FIG. 3. The difference between the semiconductor devices of FIGS. 3, 4 and FIG. 1 pertains to the structure of the source traces 210 and the drain traces 260. In this embodiment, at least one of the source traces 210 includes a second source trunk 212 and a plurality of second source branches 214a, 214b, and 214c. The second source branches 214a, 214b, and 214c are protruded from the second source trunk 212 and are disposed above the source electrodes 120. The second source trunk 212 extends substantially along the second direction D2, and the second source branches 214a, 214b, and 214c extend substantially along the first direction D1. The second source branch 214a is disposed between one of the source sub-branch 236 and one of the source electrodes 120. At least one of the third source vias 245 includes a top source via 246 and a bottom source via 248. The top source via 246 is disposed in the second dielectric layer 160, and the bottom source via 248 is disposed in the first dielectric layer 150. The source sub-branch 236 is electrically connected to the second source branch 214a through the top source via 246 of the third source via 245, and is further electrically connected to the source electrode 120 through the bottom source via 248 of the third source via 245. The second source branch 214b is disposed between the first source truck 232 and one of the source electrodes 120. The second source branch 214b is electrically connected to the first source truck 232 and the source electrodes 120. The second source branch 214c is disposed between the first drain truck 282 and one of the source electrodes 120. The second source branch 214c is electrically connected to the source electrodes 120 but is isolated from the first drain truck 282. Since the second source branches 214a, 214b, and 214c are disposed above the source electrode 120, and do not overlap the drain electrodes 130, the second source branches 214a, 214b, and 214c can further reduce the resistance of the source electrode 120 without increasing the capacitance value of the semiconductor device. In some embodiments, the second source trunk 212 and the second source branch 214a, 214b, and 214c can form a finger-shaped element.

Moreover, at least one of the drain traces 260 includes a second drain trunk 262 and a plurality of second drain branches 264a, 264b, and 264c. The second drain branches 264a, 264b, and 264c are protruded from the second drain trunk 262 and are disposed above the drain electrodes 130. The second drain trunk 262 extends substantially along the second direction D2, and the second drain branches 264a, 264b, and 264c extend substantially along the first direction D1. The second drain branch 264a is disposed between one of the drain sub-branch 286 and one of the drain electrodes 130. At least one of the third drain vias 295 includes a top drain via 296 and a bottom drain via 298. The top drain via 296 is disposed in the second dielectric layer 160, and the bottom drain via 298 is disposed in the first dielectric layer 150. The drain sub-branch 286 is electrically connected to the second drain branch 264a through the top drain via 296 of the third drain via 295, and is further electrically connected to the drain electrode 130 through the bottom drain via 298 of the third drain via 295. The second drain branch 264b is disposed between the first drain truck 282 and one of the drain electrodes 130. The second drain branch 264b is electrically connected to the first drain truck 282 and the drain electrodes 130. The second drain branch 264c is disposed between the first source truck 232 and one of the drain electrodes 130. The second drain branch 264c is electrically connected to the drain electrodes 130 but is isolated from the first source truck 232. Since the second drain branches 264a, 264b, and 264c are disposed above the drain electrode 130, and do not overlap the source electrodes 120, the second drain branches 264a, 264b, and 264c can further reduce the resistance of the drain electrode 130 without increasing the capacitance value of the semiconductor device. In some embodiments, the second drain trunk 262 and the second drain branches 264a, 264b, and 264c can form a finger-shaped element. Other relevant structural details of the present embodiment are all the same as the embodiment of FIG. 1, and, therefore, a description in this regard will not be repeated hereinafter.

Figure 5:
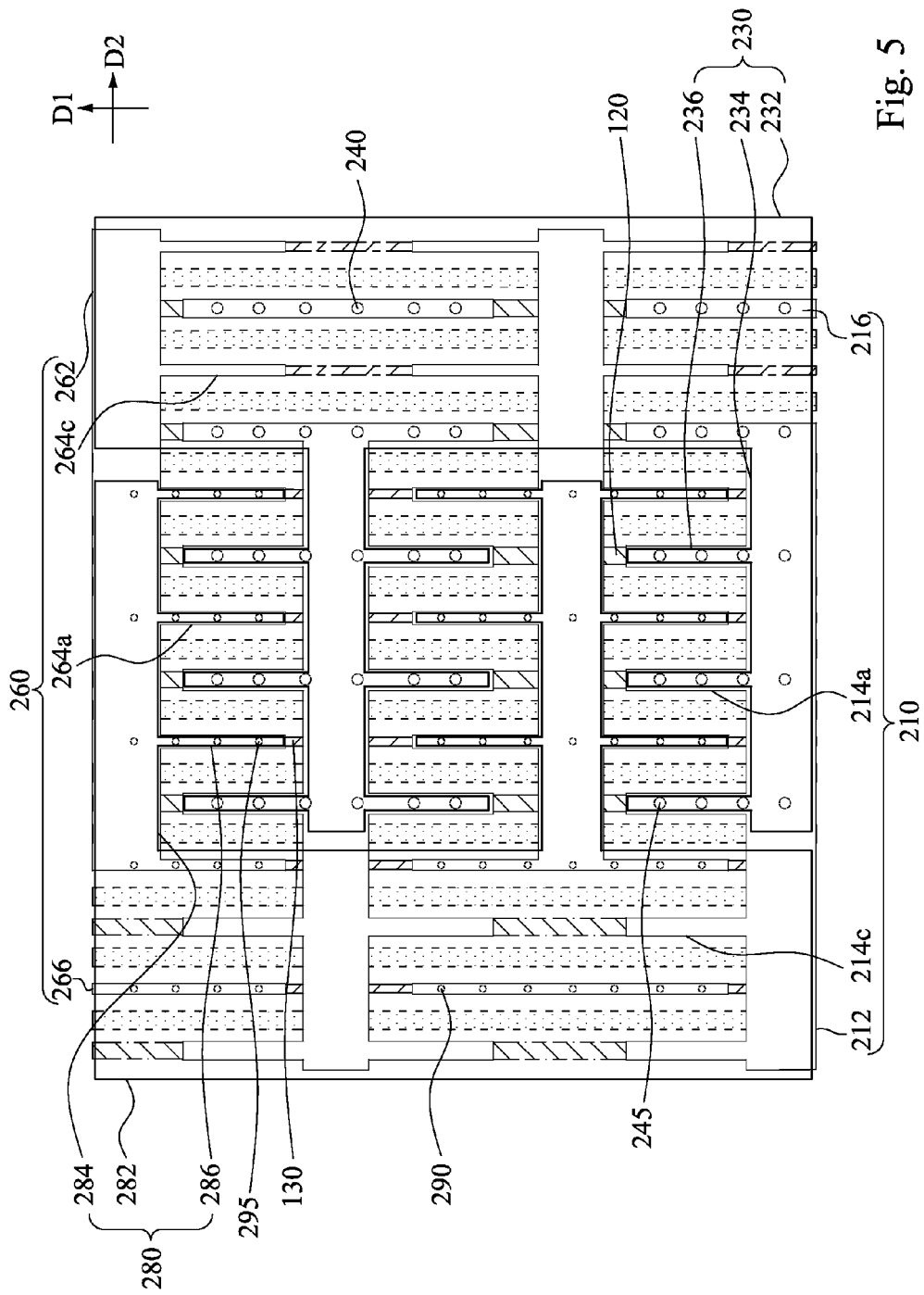
FIG. 5 is a top view of a semiconductor device according to another embodiment of the present invention.

FIG. 5 is a top view of a semiconductor device according to another embodiment of the present invention. The difference between the semiconductor devices of FIG. 5 and FIG. 3 pertains to the structure of the source traces 210 and the drain traces 260. In this embodiment, at least one of the source traces 210 further includes a plurality of source strips 216 disposed between the first source trunk 232 of the source pad 230 and the source electrodes 120. The source strips 216 are separated from each other. In greater detail, current from the first source trunk 232 can directly flow to the source electrodes 120 sequentially through the second source vias 240 (or the top source vias 246 (see FIG. 4) of the third source vias 245), the source strips 216, and the first source vias 220 (see FIG. 2A) (or the bottom source vias 248 (see FIG. 4) of the third source vias 245). Therefore, connection structures (such as the second source trunk 212) can be omitted below the first source trunk 232. Furthermore, since the source strips 216 do not overlap the drain electrodes 130, the capacitance value of the semiconductor device can be further reduced. However, the portion of the source traces 210 disposed below the first drain trunk 282 and the first source branch 234 still includes the second source trunk 212 to interconnect the second source branches 214a and 214c.

Moreover, at least one of the drain traces 260 further includes a plurality of drain strips 266 disposed between the first drain trunk 282 of the drain pad 280 and the drain electrodes 130. The drain strips 266 are separated from each other. In greater detail, current from the drain electrodes 130 can directly flow to the first drain trunk 282 sequentially trough the first drain vias 270 (see FIG. 2C) (or the bottom drain vias 298 (see FIG. 4) of the third drain vias 295), the drain strips 266, and the second drain vias 290 (or the top drain vias 296 (see FIG. 4) of the third drain vias 295). Therefore, connection structures (such as the second drain trunk 262) can be omitted below the first drain trunk 282. Furthermore, since the drain strips 266 do not overlap the source electrodes 120, the capacitance value of the semiconductor device can be further reduced. However, the portion of the drain traces 260 disposed below the first source trunk 232 and the first drain branch 284 still includes the second drain trunk 262 to interconnect the second drain branches 264a and 264c. Other relevant structural details of the present embodiment are all the same as the embodiment of FIG. 3, and, therefore, a description in this regard will not be repeated hereinafter.

Figure 6:
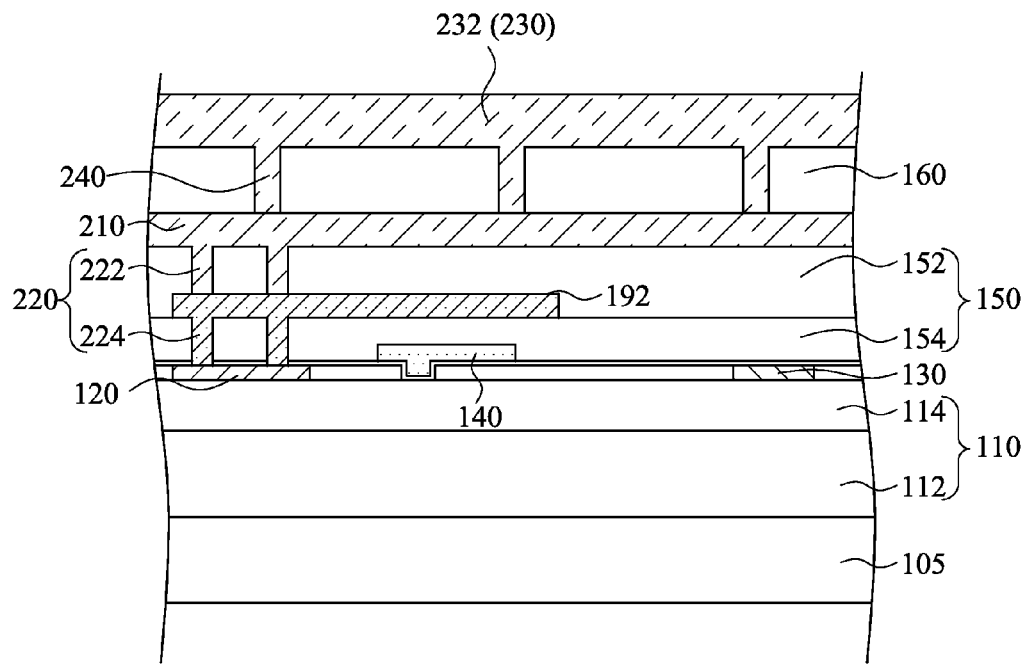
FIG. 6 is a cross-sectional view of a semiconductor device according to still another embodiment of the present invention.

FIG. 6 is a cross-sectional view of a semiconductor device according to still another embodiment of the present invention. The cross-sectional position of FIG. 6 is the same as that of FIG. 2A. The difference between the semiconductor devices of FIG. 6 and FIG. 2A pertains to the structures of the first dielectric layer 150 and the first source vias 220 and the presence of a metal layer 192. In this embodiment, the first dielectric layer 150 includes a top portion 152 and a lower portion 154 disposed between the top portion 152 and the active layer 110. At least one of the first source vias 220 includes a top source via 222 and a bottom source via 224, and the semiconductor device further includes a metal layer 192 disposed between one of the source traces 210 and one of the source electrodes 120 and between the top portion 152 and the lower portion 154. The top source via 222 is disposed in the top portion 152 and interconnects the source trace 210 and the metal layer 192, and the bottom source via 224 is disposed in the bottom portion 154 and interconnects the metal layer 192 and the source electrode 120. The metal layer 192 can further reduce the resistance of the source electrode 120. In addition, since the metal layer 192 does not overlap the drain electrodes 130, the capacitance of the semiconductor device is not increased.

Moreover, in one or more embodiments, the metal layer 192 is further disposed above the gate electrodes 140. The metal layer 192 can be utilized as a field plate to disperse the electric field of the active layer 110. Other relevant structural details of the present embodiment are all the same as the embodiment of FIG. 2A, and, therefore, a description in this regard will not be repeated hereinafter.

Figure 7A:
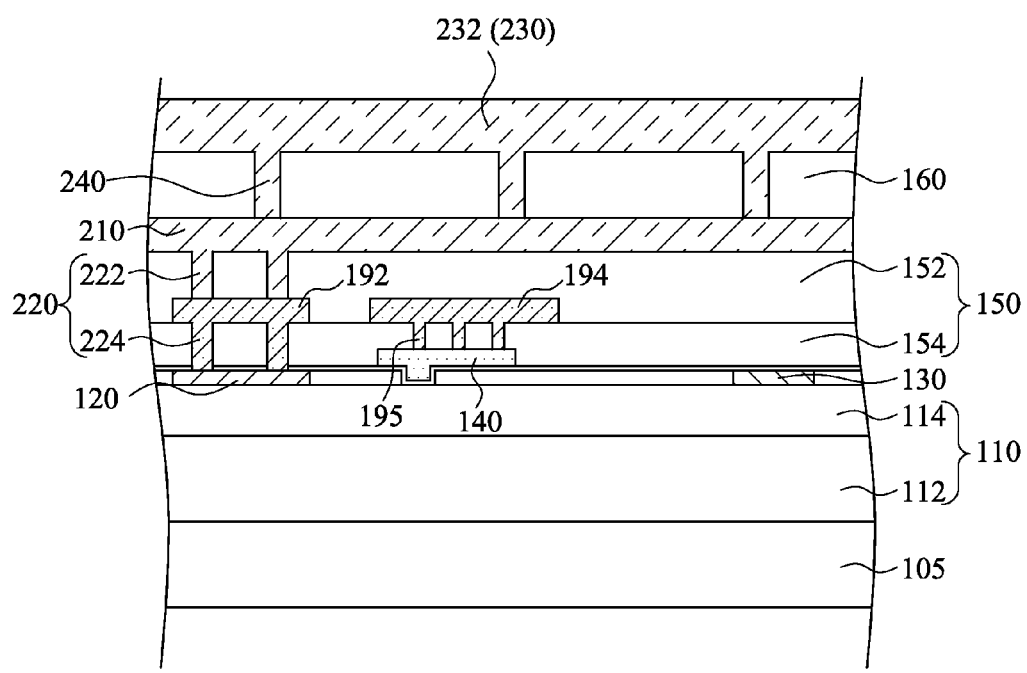
FIGS. 7A and 7B are cross-sectional views of semiconductor devices according to still another embodiment of the present invention.
Figure 7B:
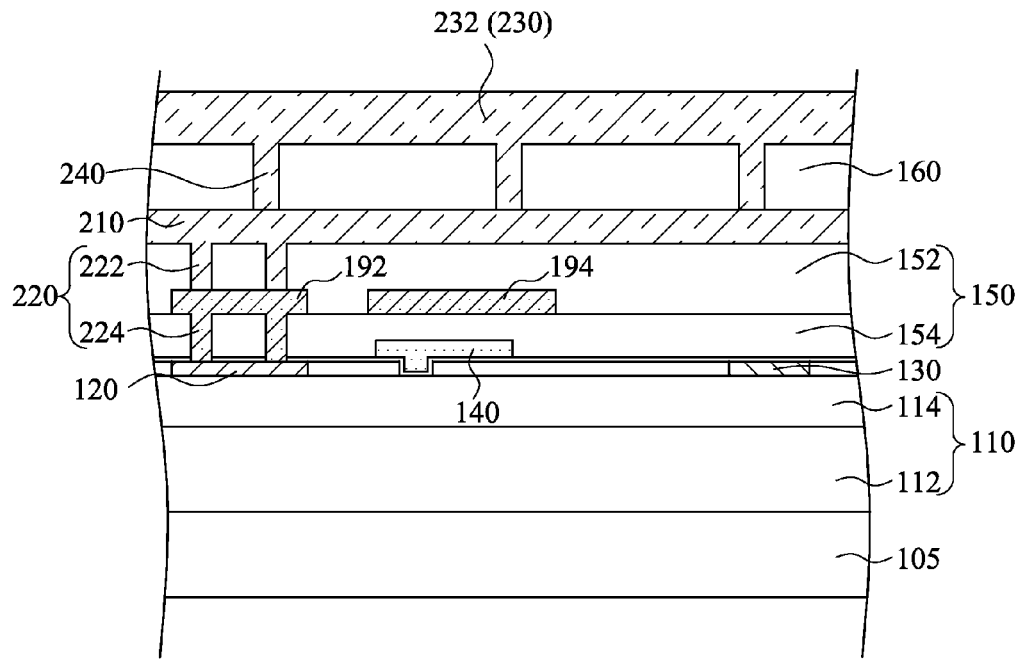

FIGS. 7A and 7B are cross-sectional views of a semiconductor devices according to still another embodiment of the present invention. The cross-sectional positions of FIGS. 7A and 7B are the same as that of FIG. 6. The difference between the semiconductor devices of FIGS. 7A, 7B and FIG. 6 pertains to the structures of the metal layer 192 and the presence of a field plate 194. In these embodiments, the metal layer 192 does not extend above the gate electrode 140, and the semiconductor device further includes a field plate 194 disposed between the top portion 152 and the bottom portion 154 and above one of the gate electrodes 140. The field plate 194 is electrically connected to the gate electrodes 140 as shown in FIG. 7A, or is electrically isolated from the gate electrodes 140, the source electrodes 120, and the drain electrodes 130 as shown in FIG. 7B. In FIG. 7A, the field plate 194 can be electrically connected to the gate electrode 140 through vias 195 or external wires (not shown). The field plate 194 can disperse the electric field of the active layer 110 while not increasing the capacitances (Cgs and Cds). In addition, there is no further manufacturing process if the field plate 194 and the metal layer 192 are formed together. Other relevant structural details of the present embodiment are all the same as the embodiment of FIG. 6, and, therefore, a description in this regard will not be repeated hereinafter.

Figure 8:
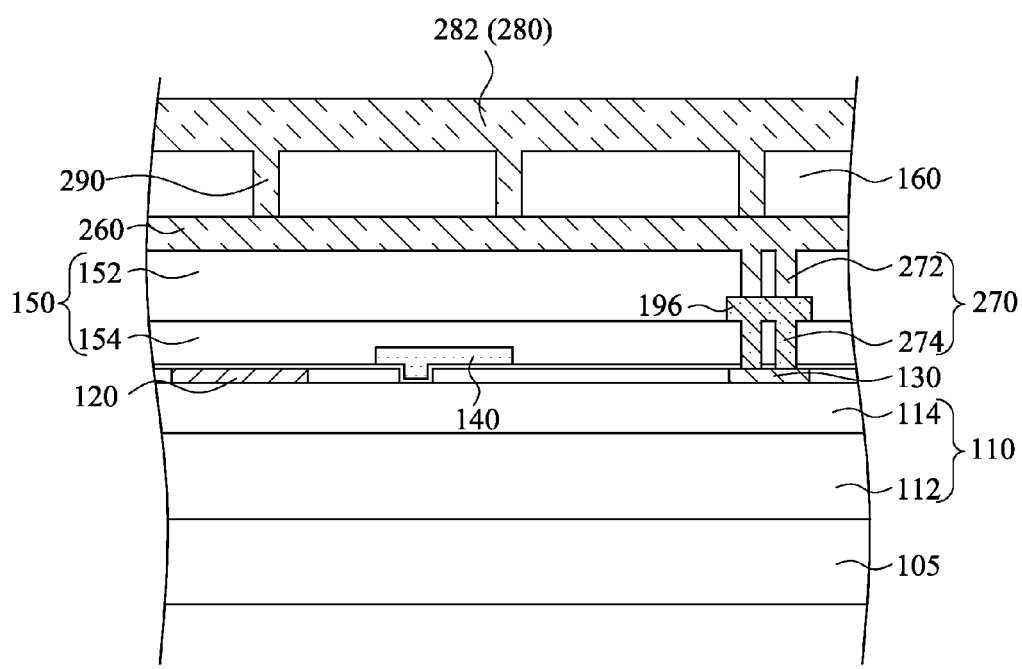
FIG. 8 is a cross-sectional view of a semiconductor device according to still another embodiment of the present invention.

FIG. 8 is a cross-sectional view of a semiconductor device according to still another embodiment of the present invention. The cross-sectional position of FIG. 8 is the same as that of FIG. 2C. The difference between the semiconductor devices of FIG. 8 and FIG. 2C pertains to the structures of the first dielectric layer 150 and the first drain vias 270 and the presence of a metal layer 196. In this embodiment, at least one of the first drain vias 270 includes a top drain via 272 and a bottom drain via 274, and the semiconductor device further includes a metal layer 196 disposed between one of the drain traces 260 and one of the drain electrodes 130 and between the top portion 152 and the lower portion 154. The top drain via 272 is disposed in the top portion 152 and interconnects the drain trace 260 and the metal layer 196, and the bottom drain via 274 is disposed in the bottom portion 154 and interconnects the metal layer 196 and the drain electrode 130. The metal layer 196 can further reduce the resistance of the drain electrode 130. In addition, since the metal layer 196 does not overlap the source electrodes 120, the capacitance of the semiconductor device is not increased. Other relevant structural details of the present embodiment are all the same as the embodiment of FIG. 2C, and, therefore, a description in this regard will not be repeated hereinafter.

Figure 9:
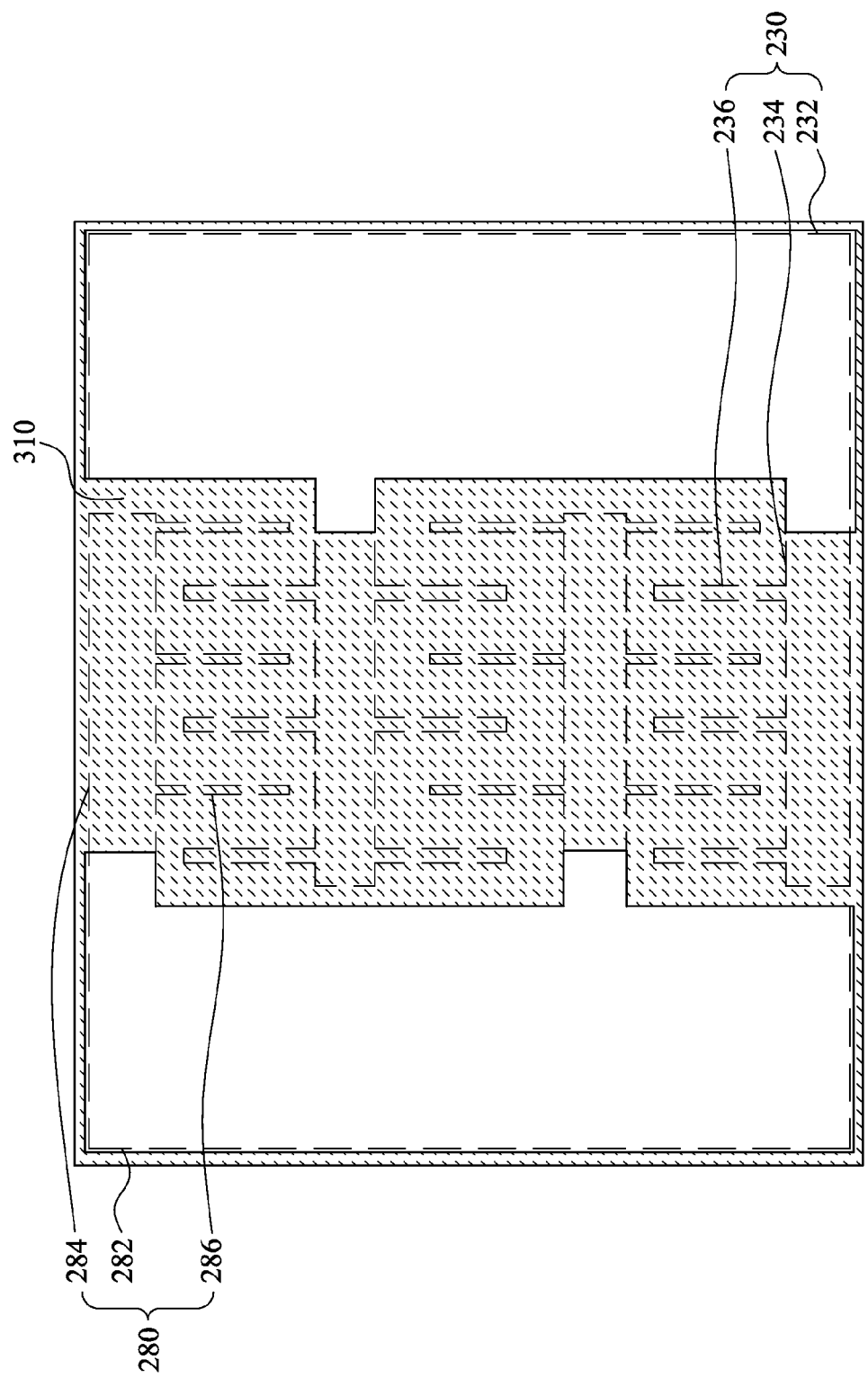
FIG. 9 is a top view of a semiconductor device according to still another embodiment of the present invention.

FIG. 9 is a top view of a semiconductor device according to still another embodiment of the present invention. The difference between the semiconductor devices of FIG. 9 and FIG. 1 pertains to the presence of an insulating layer 310. In this embodiment, the semiconductor device further includes an insulating layer 310 covering a portion of the source pad 230, the drain pad 280 and exposing the first source trunk 232, the first drain trunk 282. The insulating layer 310 can prevent the source pad 230 and the drain pad 280 from being damaged. The external circuits or wires can be electrically connected to the semiconductor device through the exposed first source trunk 232 and the exposed first drain trunk 282. Furthermore, in some embodiments, the insulating layer 310 can further exposes a portion of the first source branch 234 and a portion of the first drain branch 236 for improving heat dissipation and providing larger bonding area. Moreover, in this embodiment, the source traces and the drain traces (not shown) can have the structures shown in FIG. 1, 3, or 5, and the claimed scope is not limited in this respect. Other relevant structural details of the present embodiment are all the same as the embodiment of FIG. 1, and, therefore, a description in this regard will not be repeated hereinafter.

Figure 10:
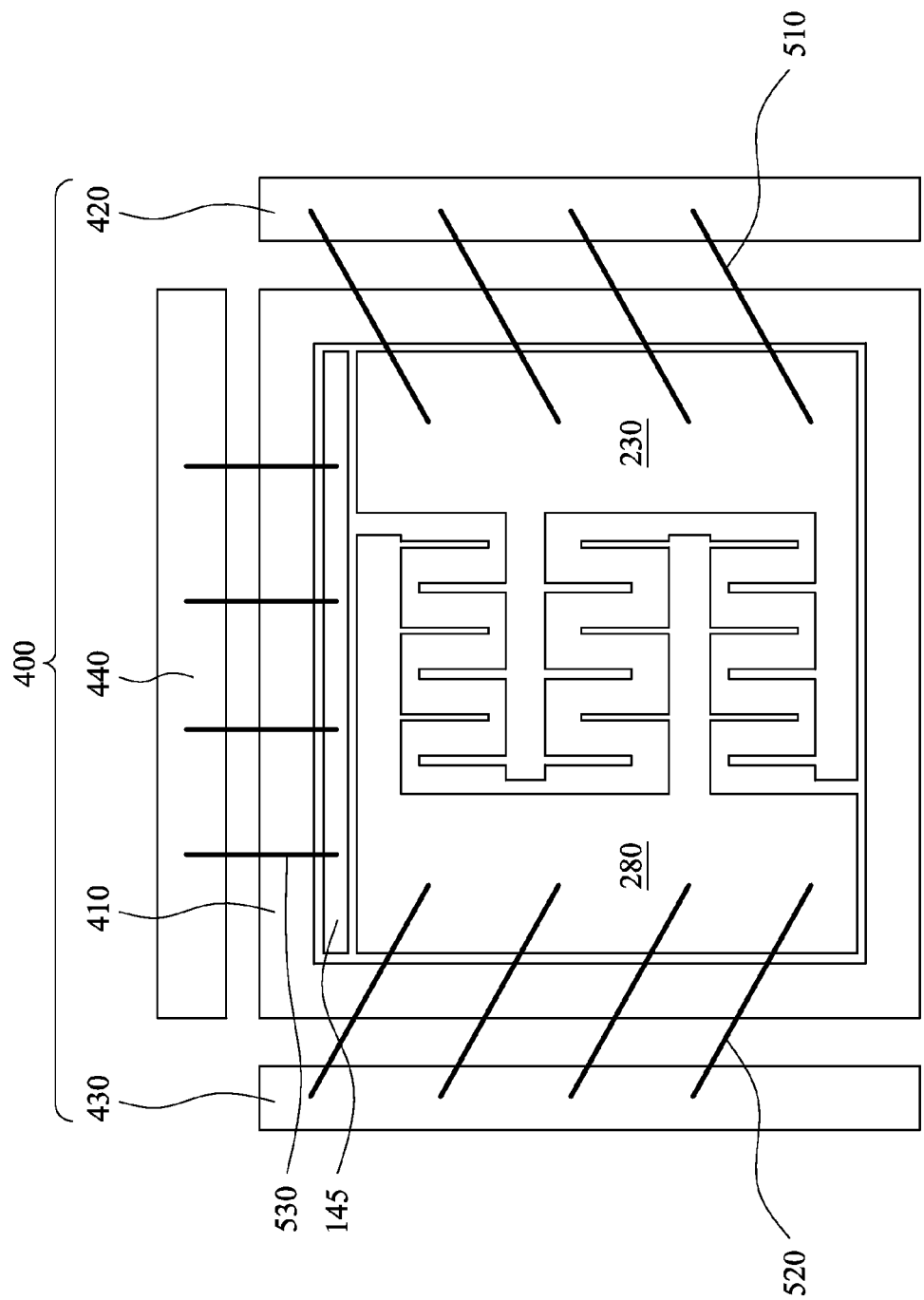
FIG. 10 is a top view of a semiconductor device according to still another embodiment of the present invention.

FIG. 10 is a top view of a semiconductor device according to still another embodiment of the present invention. The difference between the semiconductor devices of FIG. 10 and FIG. 1 pertains to the presence of a lead frame 400. In this embodiment, the semiconductor device further includes a lead frame 400 including a first portion 410, a second portion 420, a third portion 430, and a fourth portion 440. The detail structure of the semiconductor device disposed above the first portion 410 is shown in FIG. 1. Reference is made to FIGS. 1 and 10. The first portion 410 is electrically isolated from the source electrodes 120, the drain electrodes 130, and the gate electrodes 140. The substrate 105 (see FIG. 2A) is disposed between the first portion 410 and the active layer 110 (see FIG. 2A). The second portion 420 is electrically connected to the source electrodes 120. For example, the second portion 420 is electrically connected to the source electrodes 120 sequentially through conductive elements 510, the source pad 230 and the source traces 210. The third portion 430 is electrically connected to the drain electrodes 130. For example, the third portion 430 is electrically connected to the drain electrodes 130 sequentially through conductive elements 520, the drain pad 280 and the drain traces 260. The fourth portion 440 is electrically connected to the gate electrodes 140. For example, the fourth portion 440 is electrically connected to the gate electrodes 140 sequentially through conductive elements 530 and the gate pad 145. Since the first portion 410 of the lead frame 400 is electrically isolated from the source electrodes 120, the drain electrodes 130, and the gate electrodes 140, the parasitic capacitance (especially the capacitance Cds) between the first portion 410 and the active layer 110 is not increased. The conductive elements 510, 520, and 530 in this article can be the bonding wire, the ribbon, the clip, etc mentioned above. Other relevant structural details of the present embodiment are all the same as the embodiment of FIG. 1, and, therefore, a description in this regard will not be repeated hereinafter.

Figure 11:
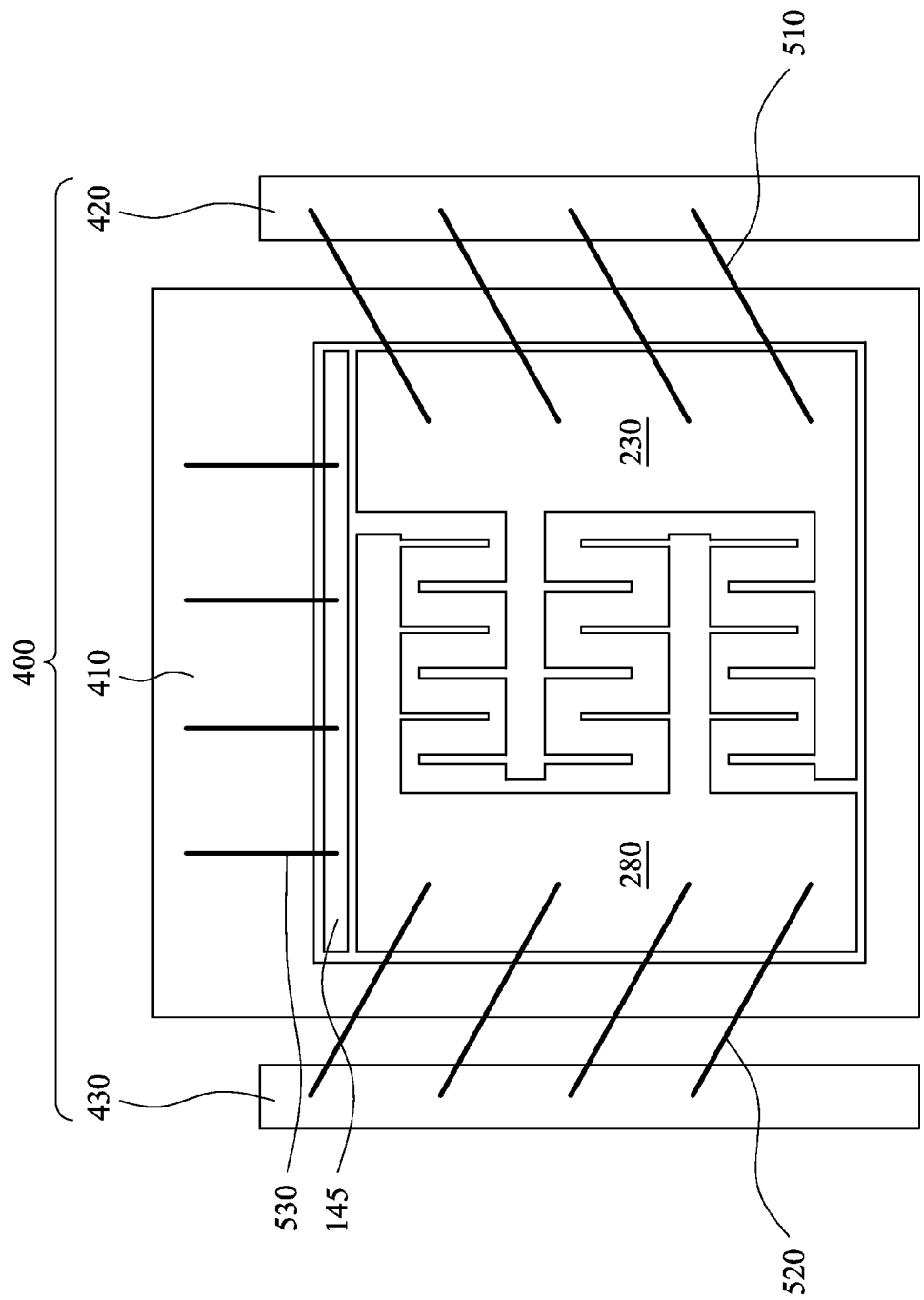
FIG. 11 is a top view of a semiconductor device according to still another embodiment of the present invention.

FIG. 11 is a top view of a semiconductor device according to still another embodiment of the present invention. The difference between the semiconductor devices of FIG. 11 and FIG. 10 pertains to the structure of the lead frame 400. In this embodiment, the first portion 410 is electrically connected to the gate electrodes 120, and the fourth portion 440 (see FIG. 10) is omitted. For example, the first portion 410 can be connected to the gate pad 145, through conductive elements 530. Since the first portion 410 of the lead frame 400 is electrically connected to the gate pad 145, the parasitic capacitance (especially the capacitance Cds) between the first portion 410 and the active layer 110 is not increased. Other relevant structural details of the present embodiment are all the same as the embodiment of FIG. 10, and, therefore, a description in this regard will not be repeated hereinafter.

Figure 12:
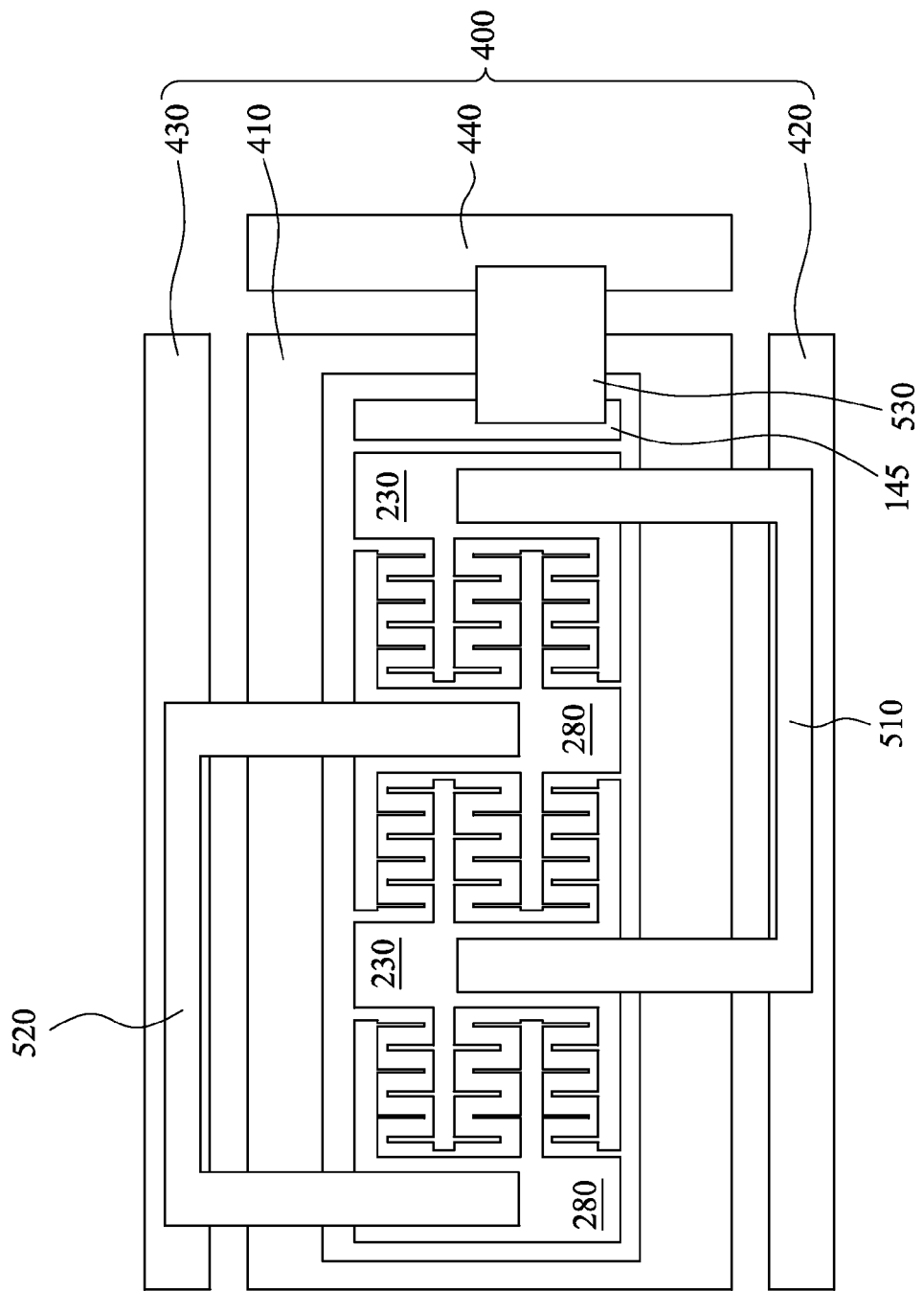
FIG. 12 is a top view of a semiconductor device according to still another embodiment of the present invention.

FIG. 12 is a top view of a semiconductor device according to still another embodiment of the present invention. The difference between the semiconductor devices of FIG. 12 and FIG. 10 pertains to the number of the source pads 230 and the drain pads 280. In this embodiment, the source pads 210 and the drain pads 260 are plural and alternately arranged with each other. With such a configuration, the conductive element 510 is electrically connected to the source pads 230, and can be finger-shaped. Also, the conductive element 520 is electrically connected to the drain pads 280, and can be finger-shaped. Other relevant structural details of the present embodiment are all the same as the embodiment of FIG. 10, and, therefore, a description in this regard will not be repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
    an active layer;
    a plurality of source electrodes disposed on the active layer and extending along a first direction;
    a plurality of drain electrodes disposed on the active layer and alternately arranged with the source electrodes;
    a plurality of gate electrodes respectively disposed between the source electrodes and the drain electrodes;
    a first dielectric layer covering the source electrodes, the drain electrodes, and the gate electrodes;
    a plurality of source traces disposed on the first dielectric layer;
    a plurality of first source vias disposed in the first dielectric layer and interconnecting the source electrodes and the source traces;
    a second dielectric layer covering the source traces;
    a source pad disposed on the second dielectric layer, wherein the source pad comprises:
        a first source trunk extending along the first direction;
        a first source branch protruded from the first source trunk and disposed above one of the source traces; and
        a source sub-branch protruded from the first source branch and disposed above one of the source electrodes; and
    a plurality of second source vias disposed in the second dielectric layer and interconnecting the source pad and the source traces.

2. The semiconductor device of claim 1, further comprising:
    a plurality of drain traces disposed on the first dielectric layer and alternately arranged with the source traces, and the second dielectric layer further covering the drain traces;
    a plurality of first drain vias disposed in the first dielectric layer and interconnecting the drain electrodes and the drain traces;
    a drain pad disposed on the second dielectric layer, wherein the drain pad comprises:
        a first drain trunk, both of the first drain electrodes and the first drain trunk extending along the first direction;
        a first drain branch protruded from the first drain trunk and disposed above one of the drain traces; and
        a drain sub-branch protruded from the first drain branch and disposed above one of the drain electrodes; and
    a plurality of second drain vias disposed in the second dielectric layer and interconnecting the drain pad and the drain traces.

3. The semiconductor device of claim 2, further comprising:
    a plurality of third drain vias disposed in both the first dielectric layer and the second dielectric layer and interconnecting the drain pad and the drain electrodes.

4. The semiconductor device of claim 2, wherein the first source branch and the first drain branch are alternately arranged.

5. The semiconductor device of claim 2, wherein the source sub-branch and the drain sub-branch are alternately arranged.

6. The semiconductor device of claim 2, wherein at least one of the drain traces comprises:
    a second drain trunk extending along a second direction, wherein the second direction is substantially perpendicular to the first direction; and
    a second drain branch protruded from the second drain trunk and disposed above one of the drain electrodes.

7. The semiconductor device of claim 2, wherein at least one of the drain traces comprises:
    a plurality of drain strips disposed between the first drain trunk of the drain pad and the drain electrodes, wherein the drain strips are separated from each other.

8. The semiconductor device of claim 2, wherein the first dielectric layer comprises a top portion and a lower portion disposed between the top portion and the active layer, at least one of the first drain vias comprises a top drain via and a bottom drain via, and the semiconductor device further comprises:
    a metal layer disposed between one of the drain traces and one of the drain electrodes and between the top portion and the lower portion, wherein the top drain via is disposed in the top portion and interconnects the drain trace and the metal layer, and the bottom drain via is disposed in the bottom portion and interconnects the metal layer and the drain electrode.

9. The semiconductor device of claim 2, further comprising:
an insulating layer covering a portion of the drain pad and exposing the first drain trunk.

10. The semiconductor device of claim 9, wherein the insulating layer further exposes a portion of the first drain branch.

11. The semiconductor device of claim 1, further comprising:
a plurality of third source vias disposed in both the first dielectric layer and the second dielectric layer and interconnecting the source pad and the source electrodes.

12. The semiconductor device of claim 1, wherein at least one of the source traces comprises:
a second source trunk extending along a second direction, wherein the second direction is substantially perpendicular to the first direction; and
a second source branch protruded from the second source trunk and disposed above one of the source electrodes.

13. The semiconductor device of claim 1, wherein at least one of the source traces comprises:
a plurality of source strips disposed between the first source trunk of the source pad and the source electrodes, wherein the source strips are separated from each other.

14. The semiconductor device of claim 1, wherein the first dielectric layer comprises a top portion and a lower portion disposed between the top portion and the active layer, at least one of the first source vias comprises a top source via and a bottom source via, and the semiconductor device further comprises:
a metal layer disposed between one of the source traces and one of the source electrodes and between the top portion and the lower portion, wherein the top source via is disposed in the top portion and interconnects the source trace and the metal layer, and the bottom source via is disposed in the bottom portion and interconnects the metal layer and the source electrode.

15. The semiconductor device of claim 14, wherein the metal layer is further disposed above one of the gate electrodes.

16. The semiconductor device of claim 14, further comprising:
a field plate disposed between the top portion and the bottom portion and above one of the gate electrodes, wherein the field plate is electrically connected to the gate electrodes.

17. The semiconductor device of claim 14, further comprising:
a field plate disposed between the top portion and the bottom portion and above one of the gate electrodes, wherein the field plate is electrically isolated from the gate electrodes, the source electrodes, and the drain electrodes.

18. The semiconductor device of claim 1, further comprising:
an insulating layer covering a portion of the source pad and exposing the first source trunk.

19. The semiconductor device of claim 18, wherein the insulating layer further exposes a portion of the first source branch.

20. The semiconductor device of claim 1, further comprising:
a substrate;
a lead frame comprising:
a first portion electrically isolated from the source electrodes, the drain electrodes, and the gate electrodes, wherein the substrate is disposed between the first portion and the active layer;
a second portion electrically connected to the source electrodes;
a third portion electrically connected to the drain electrodes; and
a fourth portion electrically connected to the gate electrodes.

21. The semiconductor device of claim 1, further comprising:
a substrate;
a lead frame comprising:
a first portion electrically connected to the gate electrodes, wherein the substrate is disposed between the first portion and the active layer;
a second portion electrically connected to the source electrodes; and
a third portion electrically connected to the drain electrodes.

22. A semiconductor device, comprising:
an active layer;
a plurality of source electrodes disposed on the active layer;
a plurality of drain electrodes disposed on the active layer, alternately arranged with the source electrodes, and extending along a first direction;
a plurality of gate electrodes respectively disposed between the source electrodes and the drain electrodes;
a first dielectric layer covering the source electrodes, the drain electrodes, and the gate electrodes;
a plurality of drain traces disposed on the first dielectric layer;
a plurality of first drain vias disposed in the first dielectric layer and interconnecting the drain electrodes and the drain traces;
a second dielectric layer covering the drain traces;
a drain pad disposed on the second dielectric layer, wherein the drain pad comprises:
a first drain trunk extending along the first direction;
a first drain branch protruded from the first drain trunk and disposed above one of the drain traces; and
a drain sub-branch protruded from the first drain branch and disposed above one of the drain electrodes; and
a plurality of second drain vias disposed in the second dielectric layer and interconnecting the drain pad and the drain traces.

* * * * *